United States Patent
Srinivasan et al.

(10) Patent No.: US 10,243,561 B2
(45) Date of Patent: Mar. 26, 2019

(54) INTERLEAVING SCHEME FOR INCREASING OPERATING EFFICIENCY DURING HIGH CURRENT EVENTS ON AN INTEGRATED CIRCUIT

(71) Applicant: Intel Corporation, Santa Clara, CA (US)

(72) Inventors: Archanna Srinivasan, San Jose, CA (US); Guang Chen, Fremont, CA (US); Jun Pin Tan, Kepong (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/852,814

(22) Filed: Dec. 22, 2017

(65) Prior Publication Data

US 2019/0044514 A1 Feb. 7, 2019

(51) Int. Cl.
| | | |
|---|---|---|
| *H03K 19/003* | (2006.01) |
| *H03K 19/00* | (2006.01) |
| *H03K 19/177* | (2006.01) |
| *G11C 7/00* | (2006.01) |

(52) U.S. Cl.
CPC ... *H03K 19/00346* (2013.01); *H03K 19/0008* (2013.01); *H03K 19/1776* (2013.01); *G11C 7/00* (2013.01)

(58) Field of Classification Search
CPC ......... H03K 19/0008; H03K 19/00346; H03K 19/1776; G11C 7/10; G11C 7/1006; G11C 7/20; G11C 7/22; G11C 5/14; G11C 5/144; G11C 5/148
See application file for complete search history.

(56) References Cited

U.S. PATENT DOCUMENTS

| | | | |
|---|---|---|---|
| 5,796,595 A | 8/1998 | Cross | |
| 6,979,980 B1 | 12/2005 | Hesterman et al. | |
| 7,149,096 B2 | 12/2006 | Batarseh et al. | |
| 7,463,057 B1* | 12/2008 | Rahim | H03K 19/1776 326/113 |
| 7,468,616 B1* | 12/2008 | Kondapalli | H03K 5/13 326/82 |
| 7,746,675 B2 | 6/2010 | Wang et al. | |
| 8,111,531 B2 | 2/2012 | Ilic | |
| 9,559,750 B2 | 1/2017 | Hui et al. | |
| 2012/0194159 A1 | 8/2012 | Harriman et al. | |
| 2012/0221919 A1* | 8/2012 | Ekas | G06F 11/1048 714/758 |

(Continued)

*Primary Examiner* — Jason Crawford
(74) *Attorney, Agent, or Firm* — Treyz Law Group, P.C.; Jason Tsai

(57) ABSTRACT

An integrated circuit configured to execute multiple operations in parallel is provided. The integrated circuit may be organized into multiple logic sectors. Two or more groups of logic sectors may be executed in an interleaved fashion, where successive groups of logic sectors are activated after a predetermined amount of delay. The integrated circuit may include an array of memory cells. Rows of the memory cells may be accessed in an interleaving manner, where successive rows of memory cells are selected after a predetermined amount of delay. Operating groups of circuit components using an interleaving scheme can help improve operational efficiency while reducing power supply noise without having to increase die area for on-die decoupling capacitance.

20 Claims, 9 Drawing Sheets

(56) References Cited

U.S. PATENT DOCUMENTS

2015/0154114 A1* 6/2015 Han ................... G06F 12/0607
                                                                711/157
2016/0118988 A1* 4/2016 Sood ............... H03K 19/17784
                                                                327/538
2017/0103157 A1* 4/2017 Hutton ............... G06F 17/5027

* cited by examiner

INTERLEAVING SCHEME FOR INCREASING OPERATING EFFICIENCY DURING HIGH CURRENT EVENTS ON AN INTEGRATED CIRCUIT

BACKGROUND

This relates to integrated circuits and, more particularly, to programmable integrated circuits.

Programmable integrated circuits are a type of integrated circuit that can be programmed by a user to implement a desired custom logic function. In a typical scenario, a logic designer uses computer-aided design tools to design a custom logic circuit. When the design process is complete, the computer-aided design tools generate configuration data. The configuration data is loaded into memory elements on a programmable integrated circuit to configure the device to perform the functions of the custom logic circuit. Such types of programmable integrated circuits are sometimes referred to as a field-programmable gate array (FPGA).

Operations on a conventional FPGA can often times create large current draws within a short time period, which can result in large power delivery noise that negatively impacts device performance and functionality. One way to mitigate this noise is to increase on-die decoupling capacitor. Implementing on-die capacitors increases the required die area and significantly increases cost (i.e., the amount of decoupling capacitance needed to mitigate the high current events is prohibitively large). Another way to mitigate the power delivery noise is by implementing staging, which involves dividing an operation into multiple stages, executing one stage at a time, and waiting for the current stage to finish before starting another stage. Staging helps mitigate the noise but is very time consuming.

During high current draw events on an FPGA, voltage sag may develop at the power rails. Voltage sag analysis for an FPGA design due to large current draws is more challenging than for a standard ASIC (Application-Specific Integrated Circuit) design since ASIC designs have fewer power domains and employ power gating. FPGA design on the other hand has many more power domains and lots of cross-domain signals, so the interaction among the different power rails is more complex.

It is within this context that the embodiments described herein arise.

DETAILED DESCRIPTION

The present embodiments relate to using a programmable integrated circuit to execute high current events. Instead of starting high current operations sequentially or simultaneously, two or more operations can be interleaved with proper delay so that the high current events are not aligned. A "high current event" may be defined as any loading event that causes the power rails to exhibit a current spike exceeding a predetermined current threshold level (e.g., 0.2 A, 0.4 A, 0.8 A, 1 A, 5 A, 10 A, etc.) or that causes the power rails to exhibit a voltage perturbation such as a voltage sag or voltage peak from the nominal power supply voltage level exceeding a predetermined voltage threshold level (e.g., 5 mV, 10 mV, 20 mV, 50 mV, etc.). Parallelism achieved via interleaving helps to improve operational efficiency without substantially increasing noise. As a result, the need for adding on-die capacitance is significantly reduced, thereby saving die area and reducing cost.

It will be recognized by one skilled in the art, that the present exemplary embodiments may be practiced without some or all of these specific details. In other instances, well-known operations have not been described in detail in order not to unnecessarily obscure the present embodiments.

Figure 1:
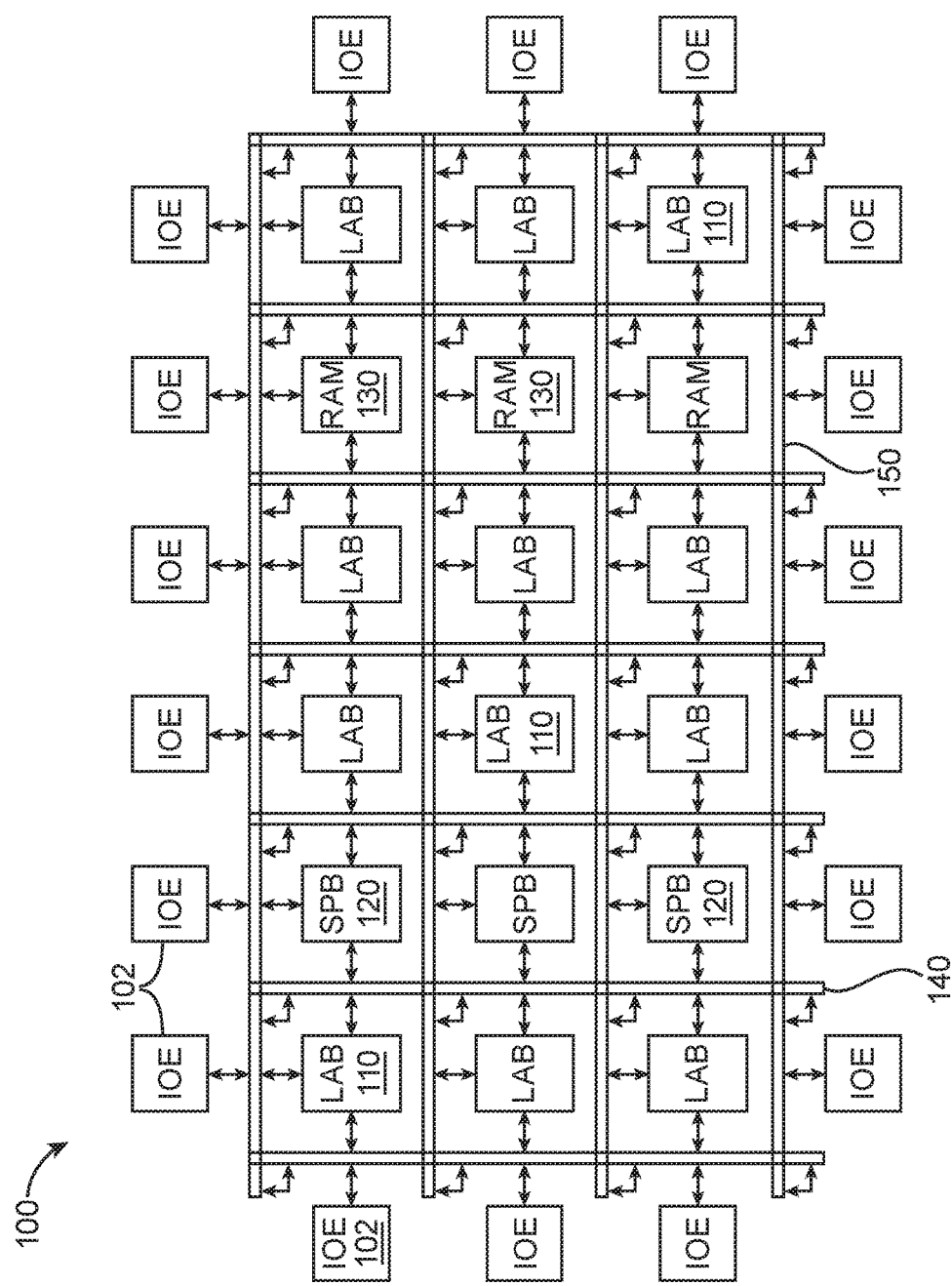
FIG. 1 is a diagram of an illustrative programmable integrated circuit in accordance with an embodiment.

An illustrative embodiment of an integrated circuit such as programmable logic device (PLD) 100 having an exemplary interconnect circuitry is shown in FIG. 1. As shown in FIG. 1, the programmable logic device (PLD) may include a two-dimensional array of functional blocks, including logic array blocks (LABs) 110 and other functional blocks, such as random access memory (RAM) blocks 130 and specialized processing blocks such as specialized processing blocks (SPB) 120. Functional blocks such as LABs 110 may include smaller programmable regions (e.g., logic elements, configurable logic blocks, or adaptive logic modules) that receive input signals and perform custom functions on the input signals to produce output signals.

Programmable logic device 100 may contain programmable memory elements. Memory elements may be loaded with configuration data (also called programming data) using input/output elements (IOEs) 102. Once loaded, the memory elements each provide a corresponding static control signal that controls the operation of an associated functional block (e.g., LABs 110, SPB 120, RAM 130, or input/output elements 102).

In a typical scenario, the outputs of the loaded memory elements are applied to the gates of metal-oxide-semiconductor transistors in a functional block to turn certain transistors on or off and thereby configure the logic in the functional block including the routing paths. Programmable logic circuit elements that may be controlled in this way include parts of multiplexers (e.g., multiplexers used for forming routing paths in interconnect circuits), look-up tables, logic arrays, AND, OR, NAND, and NOR logic gates, pass gates, etc.

The memory elements may use any suitable volatile and/or non-volatile memory structures such as random-access-memory (RAM) cells, fuses, antifuses, programmable read-only-memory memory cells, mask-programmed and laser-programmed structures, mechanical memory devices (e.g., including localized mechanical resonators), mechanically operated RAM (MORAM), combinations of these structures, etc. Because the memory elements are loaded with configuration data during programming, the memory elements are sometimes referred to as configuration memory, configuration RAM (CRAM), configuration memory elements, or programmable memory elements.

In addition, the programmable logic device may have input/output elements (IOEs) 102 for driving signals off of device 100 and for receiving signals from other devices. Input/output elements 102 may include parallel input/output circuitry, serial data transceiver circuitry, differential receiver and transmitter circuitry, or other circuitry used to connect one integrated circuit to another integrated circuit. As shown, input/output elements 102 may be located around the periphery of the chip. If desired, the programmable logic device may have input/output elements 102 arranged in different ways.

The PLD may also include programmable interconnect circuitry in the form of vertical routing channels 140 (i.e., interconnects formed along a vertical axis of PLD 100) and horizontal routing channels 150 (i.e., interconnects formed along a horizontal axis of PLD 100), each routing channel including at least one track to route at least one wire. If desired, the interconnect circuitry may include double data rate interconnections and/or single data rate interconnections.

Note that other routing topologies, besides the topology of the interconnect circuitry depicted in FIG. 1, are intended to be included within the scope of the present invention. For example, the routing topology may include diagonal wires, horizontal wires, and vertical wires along different parts of their extent as well as wires that are perpendicular to the device plane in the case of three dimensional integrated circuits, and the driver of a wire may be located at a different point than one end of a wire. The routing topology may include global wires that span substantially all of PLD 100, fractional global wires such as wires that span part of PLD 100, staggered wires of a particular length, smaller local wires, or any other suitable interconnection resource arrangement.

Furthermore, it should be understood that the embodiments described herein may be implemented in any integrated circuit. If desired, the functional blocks of such an integrated circuit may be arranged in more levels or layers in which multiple functional blocks are interconnected to form still larger blocks. Other device arrangements may use functional blocks that are not arranged in rows and columns.

Figure 2:
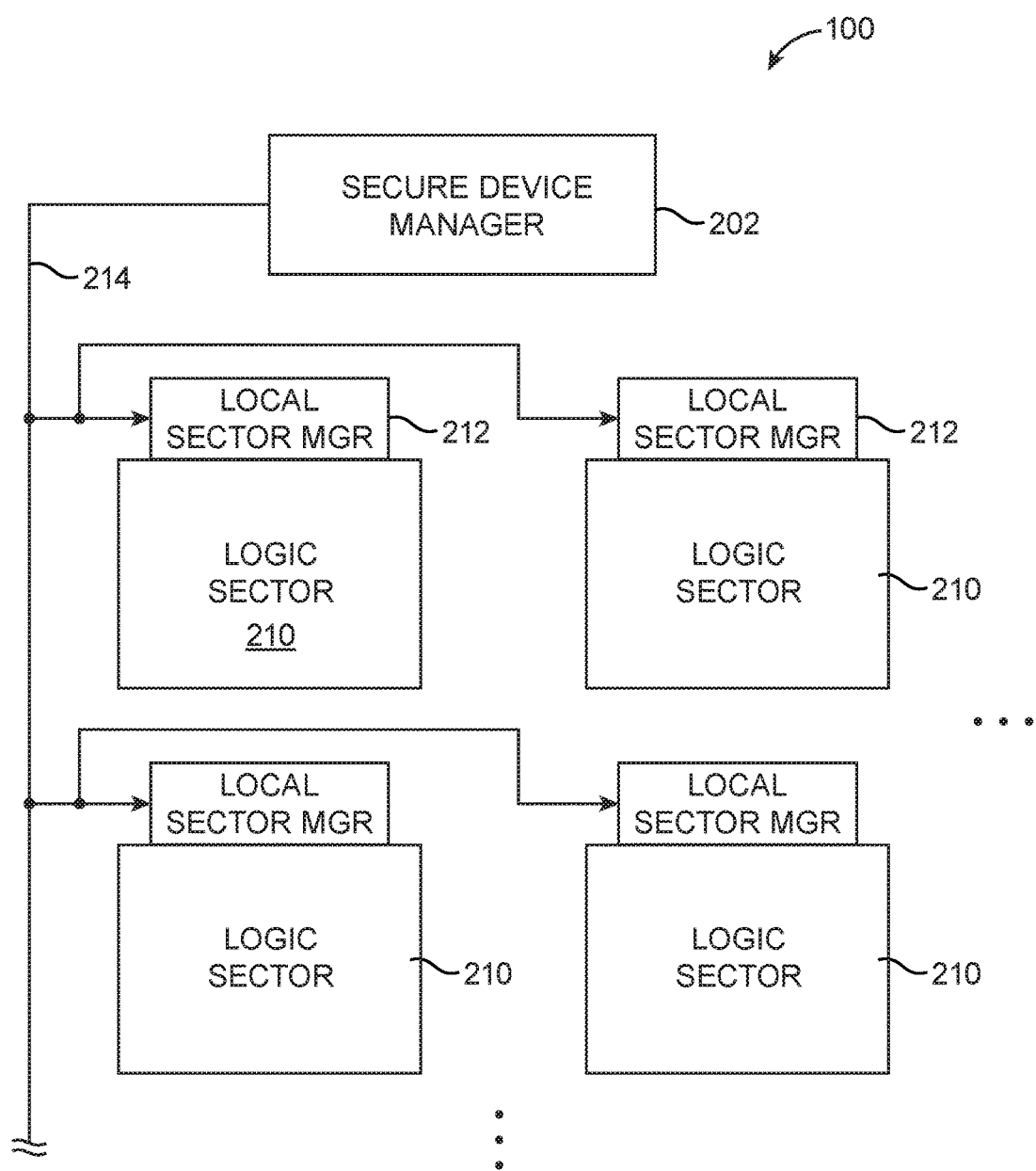
FIG. 2 is a diagram of an illustrative programmable integrated circuit having multiple logic sectors controlled by local sector managers and a secure device manager in accordance with an embodiment.

In one suitable arrangement, the logic circuitry on device 100 may be organized into logic sectors (see, e.g., FIG. 2). As shown in FIG. 2, device 100 may include multiple logic sectors 210 (sometimes referred to as logic regions). Each logic sector 210 may be managed by a respective local sector manager (LSM) 212. Local sector managers 212 (sometimes referred to as logic region manager circuits) may be controlled by a secure controller such as secure device manager (SDM) 202. Secure device manager 202 may receive configuration data (e.g., configuration bit streams) and commands from an external host and may then provide the received commands and configuration data to local sector managers 212 over a bus 214. Bus 214 coupling secure device manager 202 to local sector managers 212 may sometimes be referred to as a configuration network-on-chip (CNoC).

In some instances, the received configuration data and commands may optionally be compressed and encrypted. Thus, secure device manager 202 or some other configuration circuit on device 100 may include a decompression and decryption circuit (not shown) for decompressing and decrypting data received from the external host.

Logic sectors 210 may be individually configurable or programmable using the associated local sector manager 212. This allows each of logic sectors 210 to independently process different tasks in parallel. The parallel processing enabled by logic sectors 210 may be utilized to perform application acceleration (e.g., in a datacenter) for a variety of tasks or jobs simultaneously by reconfiguring different subsets of the logic sectors to perform the different tasks.

There are various modes in which device 100 of this configuration may be operated (e.g., in a simultaneous mode or a sequential mode). In simultaneous mode, all logic sectors 210 are started at the same time. Operating in simultaneous mode requires the least amount of time to finish task. However, the resulting peak current is unacceptably large as the current of all involved sectors/blocks are aligned. In sequential mode, a new operation is started only after current operation is completed. The resulting peak current is small in sequential mode, but it is an unacceptably time consuming process for the entire chip.

In accordance with an embodiment, in interleaving mode, all operations start one after another with proper delay. Operated in this way, peak current can be reduced while improving the operation efficiency. In other words, interleaving is a technique used to operate multiple sectors or blocks with just a little delay between each operation. The noise peaking occurs in the period right after a current step happens and is soon attenuated. Device 100 needs to load instruction or wait for data before a subsequent operation. This creates low current consumption period between high current consumption periods. Adding a proper delay between individual operations helps to reduce peak current draw by distributing the current draw over extended time, and efficiency is improved with increased parallelism.

Consider, for example, a first conventional staging scenario in which four logic sectors are started at the same time and the operation lasts 200 ns. In other words, there will be a delay of at least 200 ns between the start of each group of four logic sectors. Using the sequential mode and assuming the device includes 100 logic sectors, the total operating time would then be equal to 5 us (i.e., 100/4*200 ns). Moreover, the high current events would coincide in time, causing a large voltage sag at the power rails at the beginning of each stage when a new set of four logic sectors begins to run.

One way of decreasing the total operating time for the conventional staging scenario described above is to double the number of sectors for each stage (i.e., eight logic sectors are started at the same time instead of four). Doing so would reduce the total operating time by a half to 2.5 us (i.e., 100/8*200 ns), but would double the amount of noise since there would be two times the amount of current spike in the worst case. This would not solve the voltage sag issue.

Figure 3:
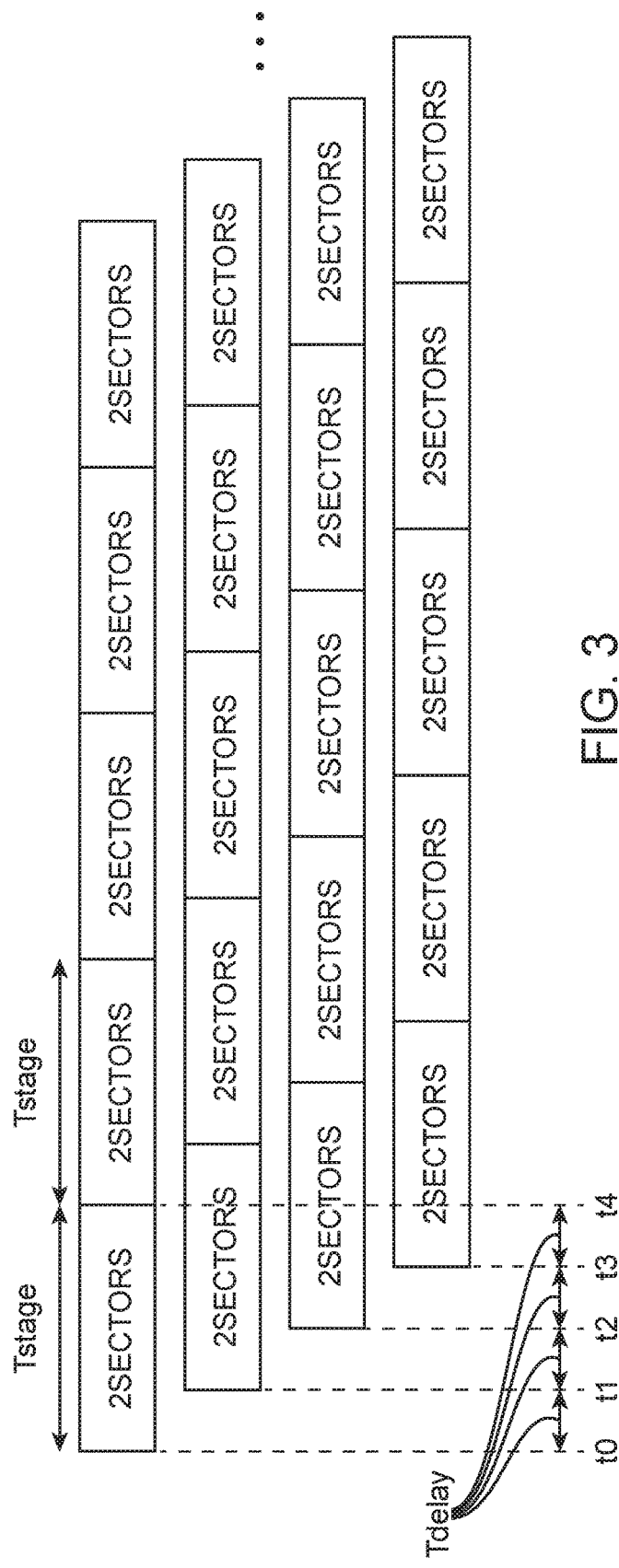
FIG. 3 is a diagram illustrating a four-way interleaving scheme in which four different groups of logic sectors are executed in a staggered fashion in accordance with an embodiment.

Instead of starting four logic sectors simultaneously in sequential mode, two logic sectors may be executed at the same time with a reduced delay of 50 ns between each logic sector pair (see, e.g., FIG. 3). FIG. 3 is a diagram illustrating a four-way interleaving scheme in which four different groups of logic sector pairs are executed in a staggered fashion. As shown in FIG. 3, a first logic sector pair in a first operation thread may be started at time t0. Each logic sector pair will perform operations that lasts a stage duration Tstage (e.g., Tstage=200 ns). After a delay Tdelay, which may be equal to Tstage/4 (e.g., 200/4=50 ns) in a four-way interleaving scheme, a first logic sector pair in a second operation thread may be started at time t1. After another delay Tdelay (at time t2), a first logic sector pair in a third operation thread may be started. After yet another delay Tdelay (at time t3), a first logic sector pair in a fourth operation thread may be started. At this point, the four operation threads are operating in parallel to process the same operation (i.e., the four logic sector pairs are processing identical operations, but at slightly offset time slots). In this four-way interleaving scheme, the four groups of logic sector pairs are at least partially operated in parallel albeit at staggered times.

At time t4, the first logic sector pair in the first operation thread has completed, so a second logic sector pair is allowed to begin to begin the next stage. This process is continued until all logic sectors involved with the operation of interest has completed. Operated in this way, the total operating time for a device that includes 100 logic sectors would be equal to approximately 2.5 us (i.e., 100/2*200 ns/4), which is about two times faster than the sequential mode. Moreover, any voltage sag is also reduced by half since each peak only corresponds to two logic sectors being initiated instead of four. These technical advantages help improve the performance of device 100 in carrying out complex, parallel operations.

This kind of interleaving can be programmed into software to make sure the signals controlling this event can perform this operation correctly based on the interleaving instruction. One of the method to realize this is to use two timers in each logic sector to schedule the interleaving. A first timer may be used to count the start time for each operation thread (e.g., to count the various Tdelay's), whereas a second timer may be used to count the interval time Tstage between successive stages in any given operation thread.

The four-way interleaving scheme of FIG. 3 is merely illustrative and does not serve to limit the scope of the present embodiments. If desired, a two-way interleaving scheme, a three-way interleaving scheme, or an interleaving scheme involving more than four parallel operation threads may be implemented. In general, each operation thread may execute any number of logic sectors or regions in parallel. Moreover, Tdelay may be adjusted as needed depending on the amount of current loading exhibited when a particular group of logic regions is initiated. For instance, if the current peak is high, Tdelay may be increased to ensure that the voltage sag has had a chance to recover before initiating a subsequent high current event. If the current peak is low, Tdelay might be decreased to help further increase operational efficiency.

Figure 4:
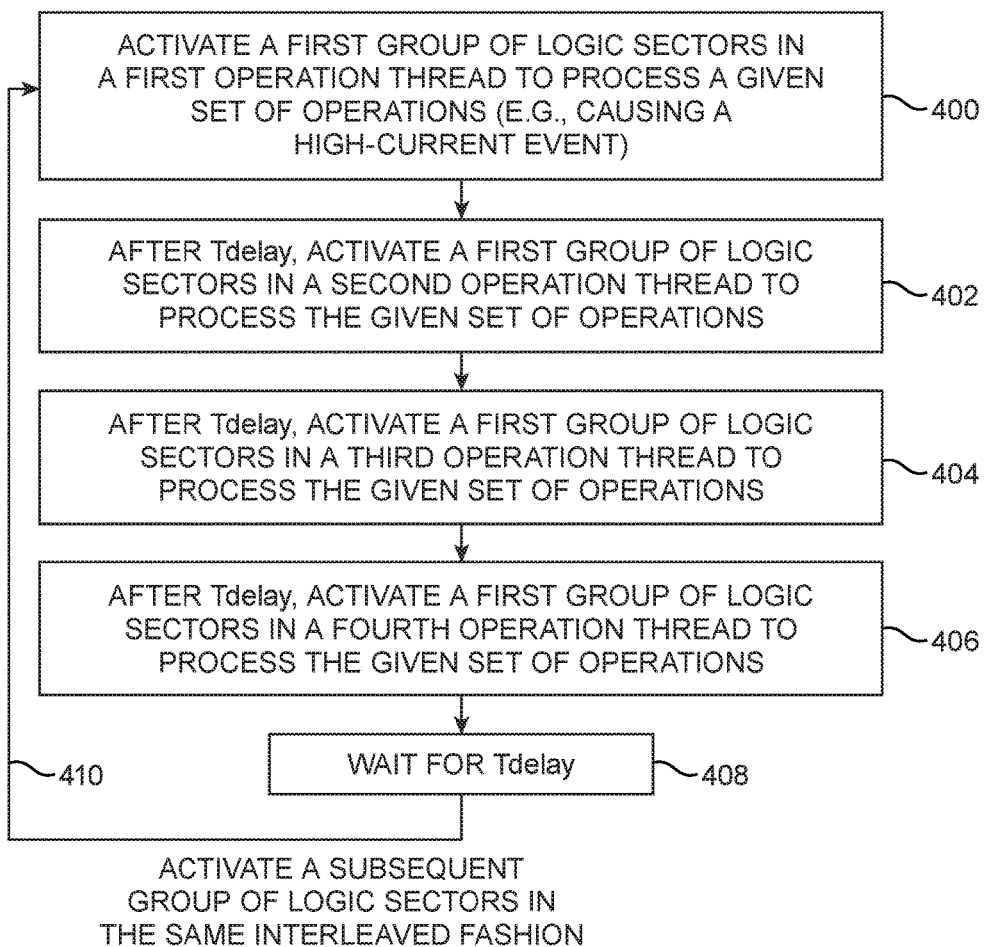
FIG. 4 is a flow chart of illustrative steps for operating the interleaving scheme of FIG. 3 in accordance with an embodiment.

FIG. 4 is a flow chart of illustrative steps for operating the interleaving scheme of FIG. 3. At step 400, a first group of logic sectors (e.g., a logic sector pair or any suitable number of logic sectors) in a first operation thread may be activated to process a given set of operations. The given set of operations may cause a high current event on device 100.

After Tdelay (step 402), a first group of logic sectors in a second operation thread may be activated to process the given set of operations. The second operation thread may process the same operations as the first thread, albeit at a slightly different start time.

After another Tdelay (step 404), a first group of logic sectors in a third operation thread may be activated to process the given set of operations. The third operation thread may process the same operations as the first and second threads, albeit at a slightly different start time.

After yet another Tdelay (step 406), a first group of logic sectors in a fourth operation thread may be activated to process the given set of operations. The fourth operation thread may process the same operations as the first, second, and third threads, albeit at a slightly different start time.

After another Tdelay (waiting at step 408), a second group of logic sectors in the first operation thread may be activated to process the given set of operations. In other words, subsequent groups of logic sectors may be activated for each operation thread in this interleaving fashion (as indicated by path 410) until all logic sectors of interest have completed the desired operation.

The process of FIG. 4 is merely illustrative. If desired, some of the steps may be performed out of order, in parallel, or even removed and additional steps may be added or inserted. In general, this method may be extended to support any suitable type of interleaving scheme.

The exemplary interleaving scheme shown in FIGS. 3 and 4 as applied to logic sectors on a programmable integrated circuit is merely illustrative. In general, the interleaving scheme may be extended to any operation that causes a temporary high current event or to any grouping of circuit components on an integrated circuit. In another suitable arrangement, the illustrative interleaving scheme may be applied to memory cell operation and, in particular, to low voltage CRAM write operations. The CRAM low voltage write operation consumes a large amount of current in a short time period and may cause an intolerable amount voltage sag at the power rail or the power supply terminal.

Figure 5:
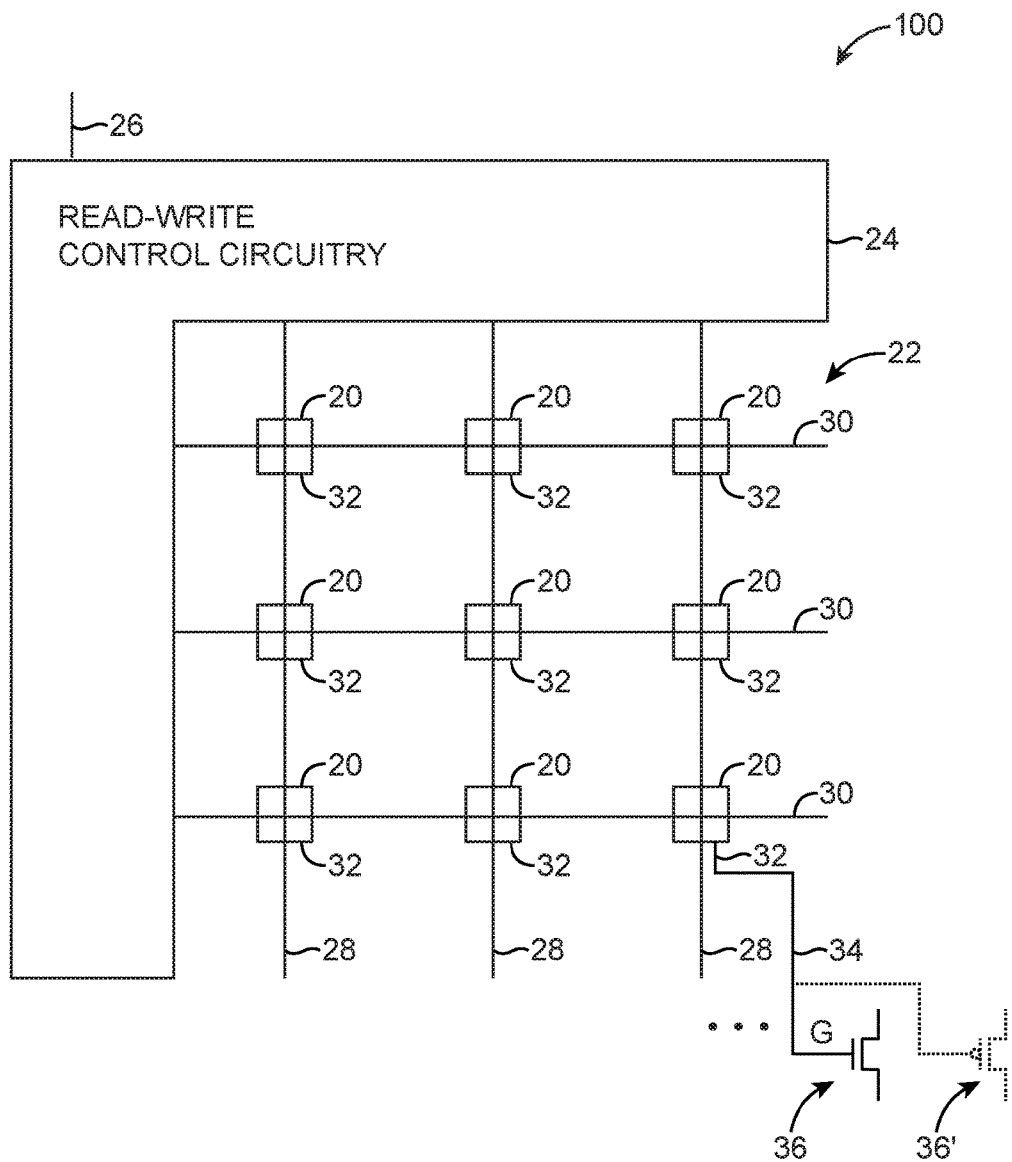
FIG. 5 is a diagram of an illustrative array of memory cells on a programmable integrated circuit in accordance with an embodiment.

FIG. 5 shows an illustrative array 22 of memory elements 20. Memory elements 20 may be volatile memory elements such as CRAM cells. Each memory cell 20 may have a corresponding output 32 on which a static output signal may be applied to the gate of a corresponding programmable transistor. For example, a path such as path 34 may be used to apply a static control signal from output 32 of a memory element 20 to a gate G of a corresponding programmable transistor (pass gate) such as pass gate 36. The programmable transistor may be an n-channel transistor such as transistor 36 or may be a p-channel transistor (see illustrative pass gate 36' in FIG. 5).

The arrangement of FIG. 5 has a 3×3 array of memory elements 20. Device 100 may, if desired have more rows and columns (e.g., hundreds or thousands of rows and columns). Read-write control circuitry 24 may obtain data to be loaded into array 22 via path 26. Data that has been read from array 22 may be provided to path 26 from memory elements 20 by read-write control circuitry 24.

Control signals on one or more control lines 30 may be used to control reading and writing operations. For example, during writing and reading operations, signals on address lines in lines 30 (sometimes referred to as word lines) may be asserted to control associated address transistors. If desired, control lines 30 may include clear lines. A clear signal may be asserted on the clear lines when it is desired to clear the contents of the memory elements 20 in array 22 (e.g., when it is desired to clear all of the memory elements in a block of memory elements simultaneously).

Data lines 28 (sometimes referred to as bit lines) may be used in conveying data from read-write control circuitry 24 to memory elements 20 during data loading operations. Data lines 28 may also be used in conveying data from memory elements 20 to read-write control circuitry 24 during data reading operations. The memory elements that are selected during reading and writing operations may be controlled by address lines 30.

There may be any suitable number of address lines and data lines associated with each memory element 20. For example, each memory element in a row of memory elements may be associated with a single address line that is used for controlling both reading and writing operations or may be associated with a write address line for use during write operations and a read address lines for use during read operations. One data line may be associated with each memory element in a column of memory elements or a pair of complementary data lines may be associated with each memory element in a column of memory elements (as examples).

Figure 6A:
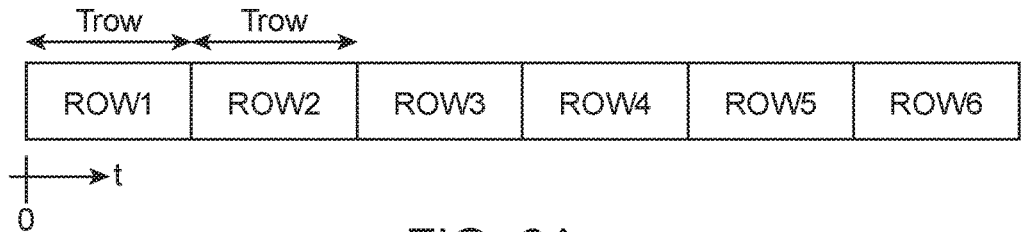
FIG. 6A is a diagram of a first scenario in which a sequence of continuous memory write operations are executed on a row-by-row basis in accordance with an embodiment.

A low voltage memory write operation may involve loading data into one or more rows of memory cells 20 while the voltage level of the word line, the bit line, and/or the power supply of the selected memory cells 20 are biased to a sufficiently low voltage level. FIG. 6A is a diagram of a first scenario in which a sequence of continuous memory write operations are executed on a row-by-row basis. Each row operation may last duration Trow. For example, Trow may be 80 ns. FIG. 6A represents a sequential memory writing mode since each row is operated one-by-one (i.e., row 1 has to complete before row 2 begins, row 2 has to complete before row 3 begins, and so on). If the entire array has only six rows, then it would take roughly 480 ns (i.e., 6*80 ns) to load the entire array.

Figure 6B:
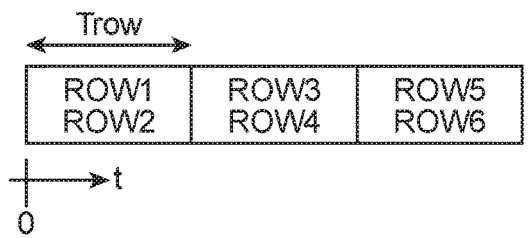
FIG. 6B is a diagram of a second scenario in which a sequence of continuous memory write operations are executed two rows at a time in accordance with an embodiment.

Instead of operating sequentially one row at a time, two rows may loaded in parallel (see, e.g., scenario 2 of FIG. 6B). As shown in FIG. 6B, rows 1 and 2 may be simultaneously written. After Trow when both rows 1 and 2 are done, then rows 3 and 4 are written. In the example where the entire array has only six rows, it would take roughly 240 ns (i.e., 6/2*80 ns) to load the entire array. While scenario 2 of FIG. 6B is two times faster than scenario 1 of FIG. 6A, the amount of current spike in scenario 2 will be doubled (due to two rows being simultaneously accessed), which can dramatically exacerbate the amount of voltage sag at the power rails.

Figure 6C:
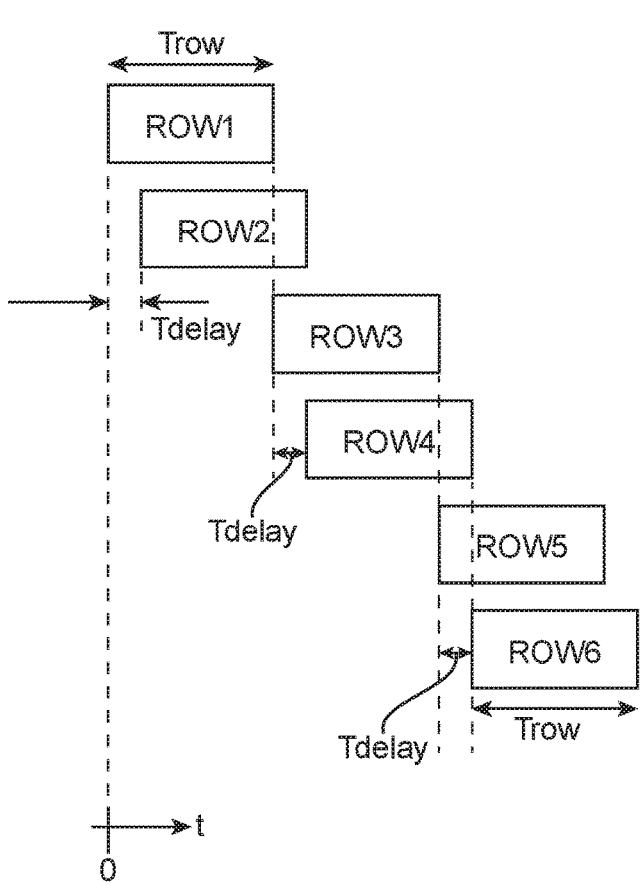
FIG. 6C is a diagram of a third scenario in which a sequence of continuous memory write operations are executed using a two-way interleaving scheme in accordance with an embodiment.

In accordance with an embodiment, FIG. 6C shows a third scenario illustrating a two-way interleaving scheme, where first and second successive rows are written in parallel, but where the second row is accessed with a predetermined Tdelay after the first row. Tdelay may be equal to 20 ns, 40 ns, 60 ns, or any suitable delay that is less than Trow. As shown in FIG. 6C, row 1 is initially accessed and written. After Tdelay, row 2 may then be accessed and written. After row 1 is complete, row 3 may then be accessed and written.

After another Tdelay, row 4 may then be accessed and written. In the example where the entire array has only six rows, it would take roughly 240 ns+Tdelay to load the entire array. As shown in this example, scenario 3 of FIG. 6C is almost as fast as scenario 2, but the amount of current spike in scenario 3 is substantially less than scenario in which two row accesses are initiated at the same time. Offsetting or staggering row access in this way can therefore improve operational efficiency while keeping voltage sag low.

Figure 7:
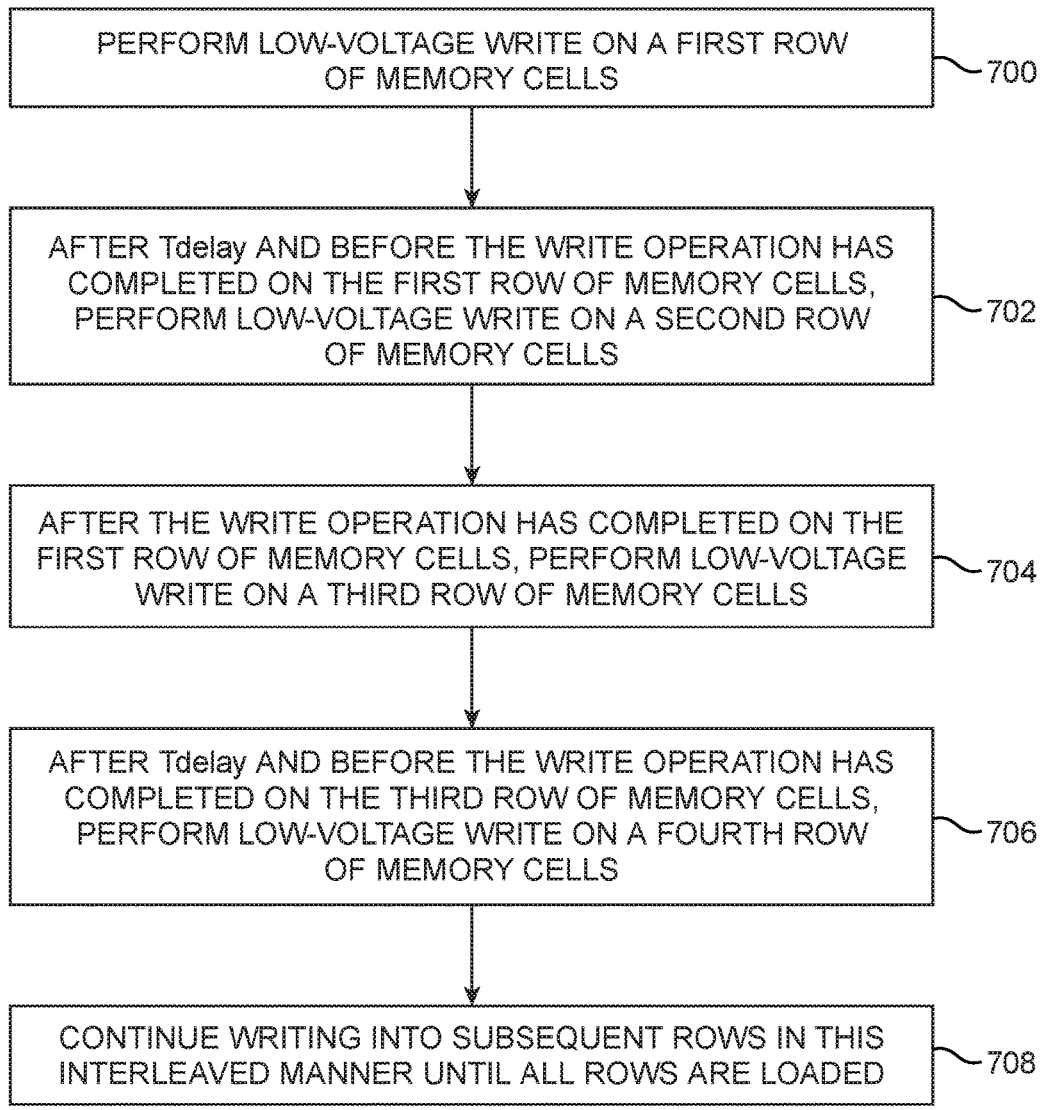
FIG. 7 is a flow chart of illustrative steps for operating the interleaving scheme of FIG. 6C in accordance with an embodiment.

FIG. 7 is a flow chart of illustrative steps for operating the interleaving scheme of FIG. 6C. At step 700, a first low voltage write operation may be performed on a first row of memory cells. After Tdelay and before the write operation as completed on the first row of memory cells, a second low voltage write operation may be performed on a second row of memory cells (step 702).

After the write operation has completed on the first row of memory cells, a third low voltage write operation may be performed on a third row of memory cells (step 704). After Tdelay and before the write operation has completed on the third row of memory cells, a fourth low voltage write operation may be performed on a fourth row of memory cells (step 706).

Data may be continually loaded into subsequent rows in this interleaving process until all rows in the array are done (step 708). The flow of FIG. 7 is merely illustrative. If desired, some of the steps may be performed out of order, in parallel, or even removed and additional steps may be added or inserted. In general, this method may be extended to support a three-way row interleaving scheme, a four-way row interleaving scheme, etc.

Figure 8A:
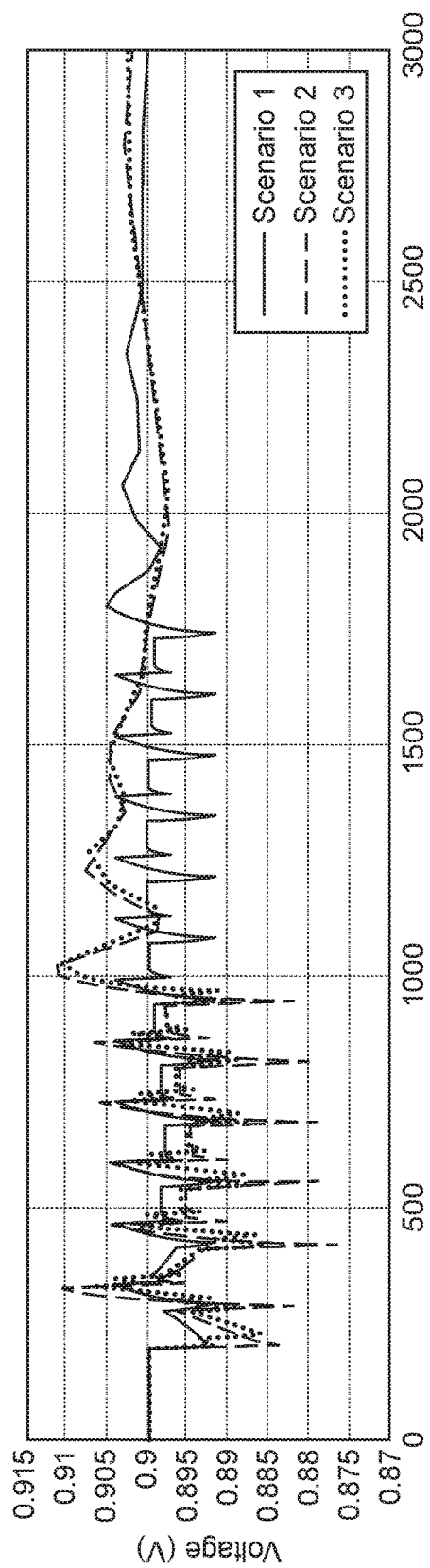
FIG. 8A is a plot illustrating voltage swings during high loading events for the three different scenarios shown in FIGS. 6A-6C in accordance with an embodiment.

The technical advantages and improvements to the operation of device 100 are illustrated in FIGS. 8 and 9. FIG. 8A is a plot illustrating voltage swings during high loading events for the three different scenarios described in connection with FIGS. 6A-6C. As shown in FIG. 8A, scenario 1 is completed around 1800 ns and has a peak-to-peak voltage swing of about 9 mV. While scenario 2 is completed around 1000 ns, the peak-to-peak voltage swing is about 25 mV, more than double that of scenario 1. Scenario 3 combines the best of both words, completing around 1000 ns and exhibiting a peak-to-peak voltage swing of around 9 mV.

Figure 8B:
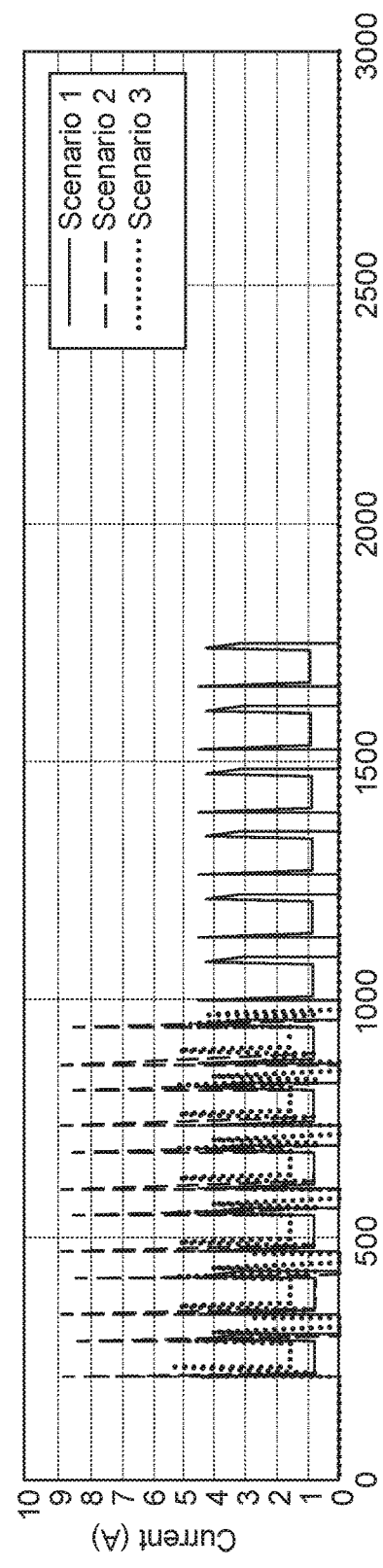
FIG. 8B is a plot illustrating current spikes corresponding to the high loading events of FIG. 8A in accordance with an embodiment.

FIG. 8B is a plot illustrating current spikes corresponding to the high loading events of FIG. 8A. As shown in FIG. 8B, scenario 1 is completed around 1800 ns and has a current spike of up to 4.5 A. While scenario 2 is completed around 1000 ns, the current spike goes up to about 9 A, which is double that of scenario 1. Scenario 3 again combines the best of both words, completing around 1000 ns and exhibiting an acceptable current spike of around 5 A.

Figure 9A:
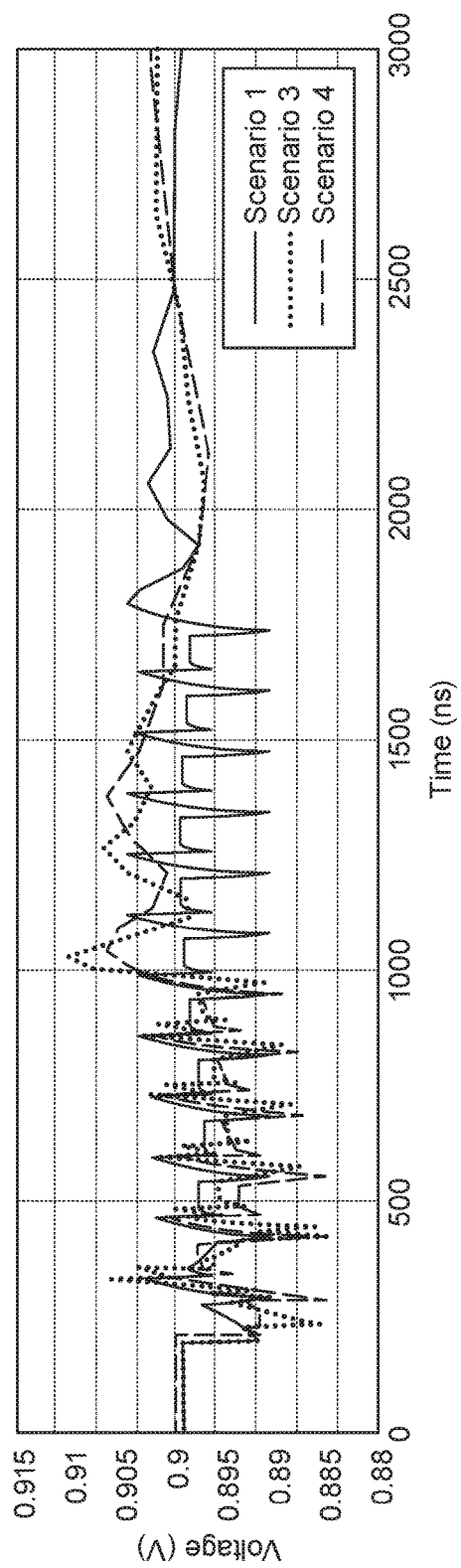
FIG. 9A is a plot showing how the interleaving scheme of FIG. 6C can achieve similar voltage swings as doubling on-die decoupling capacitance in accordance with an embodiment.
Figure 9B:
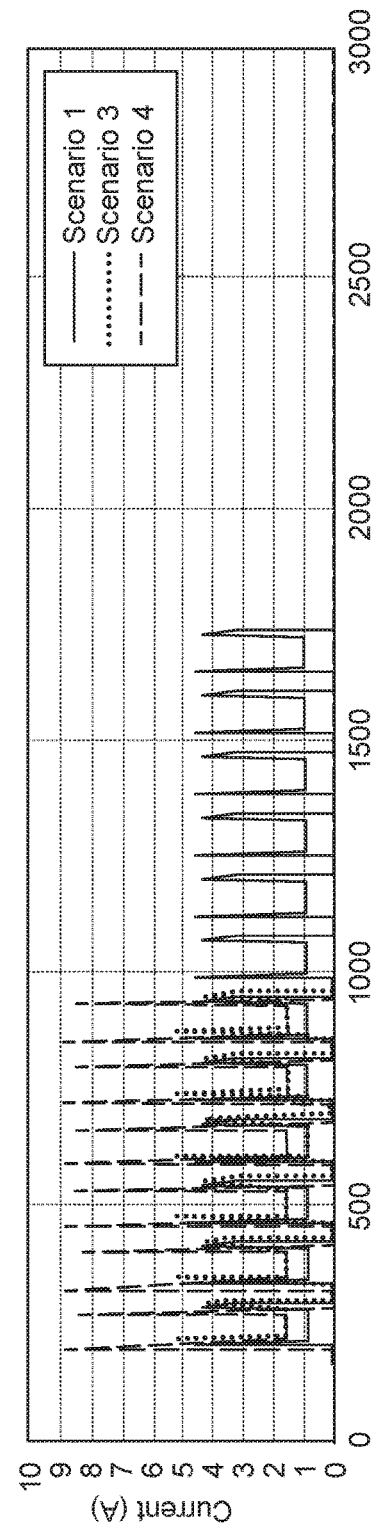
FIG. 9B is a plot showing how the interleaving scheme of FIG. 6C can achieve even smaller current spikes in accordance with an embodiment.

One way of fixing scenario 2 above is to add additional on-die decoupling capacitance. FIGS. 9A and 9B show the results of a fourth scenario (scenario 4), which is equivalent to scenario 2 provided with two times the on-die decoupling capacitance. As shown in FIG. 9A, scenario 4 exhibits fairly similar voltage behavior as scenario 3. As shown in FIG. 9B, scenario 4 exhibits the same high current behavior as scenario 2 since two rows are initiated at the same time. In other words, scenario 4 can provide improved operating efficiency but at the cost of doubling decoupling capacitance, which would dramatically drive up cost. Thus, the interleaving technique of scenario 3 is still the better approach to achieve the lowest power noise while improving operational efficiency and saving die area.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs), microcontrollers, microprocessors, central processing units (CPUs), graphics processing units (GPUs), etc. Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

EXAMPLES

The following examples pertain to further embodiments.

Example 1 is an integrated circuit, comprising: a first group of circuits configured to perform a first set of operations; and a second group of circuits configured to start performing a second set of operations a predetermined amount of delay after the first group of circuits starts performing the first set of operations and before the first group of circuits finishes performing the first set of operations to prevent power supply voltage sag, wherein the first group of circuits and the second group of circuits have identical structure.

Example 2 is the integrated circuit of example 1, wherein the first set of operations and the second set of operations are identical.

Example 3 is the integrated circuit of example 1, wherein the first group of circuits optionally comprises a first group of logic sectors, and wherein the second group of circuits optionally comprises a second group of logic sectors.

Example 4 is the integrated circuit of example 3, wherein the logic sectors in the first group are optionally configured using a first set of logic sector managers, and wherein the logic sectors in the second group are optionally configured using a second set of logic sector managers.

Example 5 is the integrated circuit of example 4, optionally further comprising a secure device manager that is coupled to both the first and second sets of logic sector managers.

Example 6 is the integrated circuit of example 1, wherein the first group of circuits optionally comprises a first row of random-access memory cells, and wherein the second group of circuits optionally comprises a second row of random-access memory cells.

Example 7 is the integrated circuit of example 6, wherein the first set of operations optionally comprises a first memory write operation on the first row of random-access memory cells that causes a first current spike event, and wherein the second set of operations optionally comprises a second memory write operation on the second row of random-access memory cells that causes a second current spike event that occurs after the first current spike event.

Example 8 is the integrated circuit of any one of examples 1-7, optionally further comprising additional groups of circuits having identical structure to the first and second groups of circuits, wherein the first, second, and additional groups of circuits are configured to perform identical operations using a two-way interleaving scheme.

Example 9 is the integrated circuit of any one of examples 1-7, optionally further comprising additional groups of circuits having identical structure to the first and second groups of circuits, wherein the first, second, and additional groups of circuits are configured to perform identical operations using a four-way interleaving scheme.

Example 10 a method of operating an integrated circuit that includes a first group of circuits and a second group of circuits, the method comprising: using the first group of circuits to perform a first set of operations; and using the second group of circuits to perform a second set of operations a predetermined amount of delay after the first group of circuits starts performing the first set of operations and before the first group of circuits finishes performing the first set of operations to prevent power supply voltage sag, wherein the first and second group of circuits are identical.

Example 11 is the method of example 10, wherein the first set of operations and the second set of operations are optionally the same.

Example 12 is the method of example 10, wherein using the first group of circuits to perform the first set of operations optionally comprises using a first group of logic sectors to perform a first set of logic functions, and wherein using the second group of circuits to perform the second set of operations optionally comprises using a second group of logic sectors to perform a second set of logic functions.

Example 13 is the method of example 12, optionally further comprising using logic sector managers to configure the first and second groups of logic sectors.

Example 14 is the method of example 10, wherein using the first group of circuits to perform the first set of operations optionally comprises loading data into a first row of memory elements, and wherein using the second group of circuits to perform the second set of operations optionally comprises loading data into a second row of memory elements.

Example 15 is the method of any one of examples 10-14, optionally further comprising: using a third group of circuits on the integrated circuit to perform a third set of operations the predetermined amount of delay after the second group of circuits starts performing the second set of operations and before the first and second groups of circuits finish performing the first and second sets of operations to prevent power supply voltage sag, wherein the first and third group of circuits are identical.

Example 16 is an integrated circuit, comprising: a first group of circuits configured to perform a first operation causing a first high current event; and a second group of circuits configured to perform a second operation causing a second high current event, wherein the first and second operations are at least partially performed in parallel to increase operational efficiency, and wherein the first and second high current events are not aligned to prevent power supply voltage sag.

Example 17 is the integrated circuit of example 16, optionally further comprising additional groups of circuits, wherein the first, second, and additional groups of circuits perform operations in a two-way interleaving fashion.

Example 18 is the integrated circuit of example 16, optionally further comprising additional groups of circuits, wherein the first, second, and additional groups of circuits perform operations in a four-way interleaving fashion.

Example 19 is the integrated circuit of any one of examples 16-18, wherein the first and second groups of circuits optionally comprise logic sectors, and wherein the logic sectors are optionally configured by respective logic sector managers.

Example 20 is the integrated circuit of any one of examples 16-18, wherein the first and second groups of circuits optionally comprise rows of memory elements, and wherein the first and second operations optionally comprise memory access operations.

Example 21 is an integrated circuit, comprising: first means for performing a first set of operations; and second means for performing a second set of operations a predetermined amount of delay after the first means starts performing the first set of operations and before the first means finishes performing the first set of operations to prevent power supply voltage sag, wherein the first and second means are identical in structure.

Example 22 is the integrated circuit of example 21, wherein the first set of operations and the second set of operations are optionally the same.

Example 23 is the integrated circuit of any one of examples 21-22, wherein the first means for performing the first set of operations optionally comprises first logic means for performing a first set of logic functions, and wherein the second means for performing the second set of operations optionally comprises second logic means for performing a second set of logic functions.

Example 24 is the integrated circuit of example 23, optionally further comprising means for configuring the first and second logic means.

Example 25 is the integrated circuit of example 21, wherein the first means for performing the first set of operations optionally comprises means for loading data into a first row of memory elements, and wherein the second means for performing the second set of operations optionally comprises means for loading data into a second row of memory elements.

For instance, all optional features of the apparatus described above may also be implemented with respect to the method or process described herein. The foregoing is merely illustrative of the principles of this disclosure and various modifications can be made by those skilled in the art. The foregoing embodiments may be implemented individually or in any combination.

What is claimed is:

1. An integrated circuit, comprising:
   a first group of circuits configured to perform a first set of operations; and
   a second group of circuits configured to start performing a second set of operations a predetermined amount of delay after the first group of circuits starts performing the first set of operations and before the first group of circuits finishes performing the first set of operations to prevent power supply voltage sag, wherein the first group of circuits and the second group of circuits have identical structure.

2. The integrated circuit of claim 1, wherein the first set of operations and the second set of operations are identical.

3. The integrated circuit of claim 1, wherein the first group of circuits comprises a first group of logic sectors, wherein the second group of circuits comprises a second group of logic sectors, wherein the first group of logic sectors start performing the first set of operations at a first point in time, and wherein the second group of logic sectors start performing the second set of operations at a second point in time before the first group of logic sectors finishes performing the first set of operations.

4. The integrated circuit of claim 3, wherein the logic sectors in the first group are configured using a first set of logic sector managers, and wherein the logic sectors in the second group are configured using a second set of logic sector managers.

5. The integrated circuit of claim 4, further comprising a secure device manager that is coupled to both the first and second sets of logic sector managers.

6. The integrated circuit of claim 1, wherein the first group of circuits comprises a first row of random-access memory cells, and wherein the second group of circuits comprises a second row of random-access memory cells.

7. The integrated circuit of claim 6, wherein the first set of operations comprises a first memory write operation on the first row of random-access memory cells that causes a first current spike event, and wherein the second set of operations comprises a second memory write operation on the second row of random-access memory cells that causes a second current spike event that occurs after the first current spike event.

8. The integrated circuit of claim 1, further comprising additional groups of circuits having identical structure to the first and second groups of circuits, wherein the first, second, and additional groups of circuits are configured to perform identical operations using a two-way interleaving scheme.

9. The integrated circuit of claim 1, further comprising additional groups of circuits having identical structure to the first and second groups of circuits, wherein the first, second, and additional groups of circuits are configured to perform identical operations using a four-way interleaving scheme.

10. A method of operating an integrated circuit that includes a first group of circuits and a second group of circuits, the method comprising:
    using the first group of circuits to perform a first set of operations; and
    using the second group of circuits to perform a second set of operations a predetermined amount of delay after the first group of circuits starts performing the first set of operations and before the first group of circuits finishes performing the first set of operations to prevent power supply voltage sag, wherein the first and second group of circuits are identical.

11. The method of claim 10, wherein the first set of operations and the second set of operations are the same.

12. The method of claim 10, wherein using the first group of circuits to perform the first set of operations comprises using a first group of logic sectors to perform a first set of logic functions, and wherein using the second group of circuits to perform the second set of operations comprises using a second group of logic sectors to perform a second set of logic functions.

13. The method of claim 12, further comprising using logic sector managers to configure the first and second groups of logic sectors.

14. The method of claim 10, wherein using the first group of circuits to perform the first set of operations comprises loading data into a first row of memory elements, and wherein using the second group of circuits to perform the second set of operations comprises loading data into a second row of memory elements.

15. The method of claim 10, further comprising:
using a third group of circuits on the integrated circuit to perform a third set of operations the predetermined amount of delay after the second group of circuits starts performing the second set of operations and before the first and second groups of circuits finish performing the first and second sets of operations to prevent power supply voltage sag, wherein the first and third group of circuits are identical.

16. An integrated circuit, comprising:
a first group of circuits configured to perform a first set of logic functions causing a first high current event; and
a second group of circuits configured to perform a second set of logic functions causing a second high current event, wherein the first and second sets of logic functions are at least partially performed in parallel to increase operational efficiency, and wherein the first and second high current events are not aligned to prevent power supply voltage sag.

17. The integrated circuit of claim 16, further comprising additional groups of circuits, wherein the first, second, and additional groups of circuits perform operations in a two-way interleaving fashion.

18. The integrated circuit of claim 16, further comprising additional groups of circuits, wherein the first, second, and additional groups of circuits perform operations in a four-way interleaving fashion.

19. The integrated circuit of claim 16, wherein the first and second groups of circuits comprise logic sectors, and wherein the logic sectors are configured by respective logic sector managers.

20. The integrated circuit of claim 16, wherein the first group of circuits is configured to perform a third set of logic functions before the second group of circuits finishes performing the second set of logic functions.

* * * * *